United States Patent
Lewyn

[19]

[11] Patent Number: 6,100,834
[45] Date of Patent: Aug. 8, 2000

[54] RECURSIVE MULTI-BIT ADC WITH PREDICTOR

[75] Inventor: Lanny L. Lewyn, Laguna Beach, Calif.

[73] Assignee: Pairgain Technologies, Inc., Tustin, Calif.

[21] Appl. No.: 09/079,965

[22] Filed: May 15, 1998

[51] Int. Cl.$^7$ .................................................. H03M 1/10
[52] U.S. Cl. ........................................ 341/155; 341/156
[58] Field of Search ................................. 341/139, 156, 341/155

[56] References Cited

U.S. PATENT DOCUMENTS

| | | |
|---|---|---|
| 4,317,208 | 2/1982 | Araseki et al. ............................ 375/27 |
| 4,665,380 | 5/1987 | Lewyn . |
| 4,792,787 | 12/1988 | Speiser et al. ........................... 341/156 |
| 4,875,046 | 10/1989 | Lewyn . |
| 4,899,153 | 2/1990 | Lewyn . |
| 4,926,176 | 5/1990 | Lewyn et al. . |
| 4,983,973 | 1/1991 | Lewyn . |
| 5,099,205 | 3/1992 | Lewyn . |
| 5,130,570 | 7/1992 | Lewyn . |
| 5,163,019 | 11/1992 | Lewyn . |
| 5,206,647 | 4/1993 | Stone ....................................... 341/139 |
| 5,266,952 | 11/1993 | Stone et al. ............................... 341/156 |
| 5,640,162 | 6/1997 | Lewyn . |
| 5,781,132 | 7/1998 | Lewyn . |

*Primary Examiner*—Howard L. Williams
*Attorney, Agent, or Firm*—Jeffrey Slusher

[57] ABSTRACT

A flash converter is preceded by an accurate continuous-time error amplifier operating on the difference between the input signal and a feedback DAC. The DAC output is operatively coupled to the amplifier input virtual ground or summing node through, for example, a set of precision capacitors. The input circuit is also coupled to the amplifier input through a continuous-time element such as a set of precision capacitors, approximately equal in capacitance to those coupled to the DAC. The amplifier may have a moderate closed-loop forward gain such as 16 with a high-pass characteristic beyond, for example, 10 Hz. The DAC is controlled by the latched output of a digital signal processing block, which uses digital outputs from the flash converter and the last latched output to predict the next value of the input signal. Converter control loop stability is afforded by providing a lowpass character to the prediction circuit. The converter produces a digital result by adding the digital value produced by the flash, properly scaled, to the current digital output value of the digital latch driving the DAC. The digital result may be sub-sampled at any arbitrary phase of the input sampling clock to permit optimum-phase data recovery.

15 Claims, 3 Drawing Sheets

RECURSIVE MULTI-BIT ADC WITH PREDICTOR

BACKGROUND OF THE INVENTION

1. Field of the Invention

This invention relates in general to analog-to-digital converters (ADCs) and more particularly to high-speed, high-resolution, monolithic integrated circuit ADCs.

2. Description of the Related Art

Prior art analog to digital converters (ADCs) requiring high conversion rates and low latency typically use a string of stacked comparators connected to progressive voltages in a resistive ladder in a configuration well known as a basic flash converter. Significant amounts of research funds in telecommunications technology are continually being invested in order to increase speed and resolution within a limited number of prior art ADC circuit architectures.

Basic flash converters operate at very high speeds, in large part because they produce a complete data conversion for each clock cycle. An n-bit flash converter, however, typically requires $2^n$ comparators, which are connected to progressively increasing voltage steps on a resistive ladder. The outputs of the comparators may be routed to a circuit widely known as a "thermometer" binary digital coding circuit to produce an n-bit binary output. As its name implies, the main advantage of the flash converter is its speed. Furthermore, these devices require no input sample-and-hold.

On the other hand, flash converters suffer from several well-known limitations, which become more pronounced at resolutions beyond eight bits. As is pointed out above, the number of comparators increases exponentially with resolution expressed in binary bits. Consequently, 256 comparators are needed even for modest 8-bit resolution. Further limitations include differential phase errors from clock skew, very large circuit area, and significant charge blowback.

Recent work directed toward overcoming the limitations described above have focused on multiple-stage flash converters (also known as "pipelined" flash converters) that use fewer bits per stage and thus reduce blowback, clock skew and circuit area. In these multiple-stage devices, each stage includes an input sample-and-hold circuit. Each stage in the pipeline then uses its own, separate flash converter to assess the magnitude of the input, and it then and feeds the digital result to a digital-to-analog converter (DAC) in a feedback loop. The difference between the DAC result and the input sample-and-hold output is amplified and fed to the sample-and-hold input of the next stage. Once the next stage has sampled the amplifier output signal, the previous stage is free to receive the next input signal.

As an example of one problem associated with the pipelined arrangement, assume the amplifier in the pipelined flash converter has a moderate gain of 16. The input signal to the first stage must in any event be sampled and held while the first flash converter estimates its amplitude and while the estimated amplitude output of the feedback DAC is subtracted from the input signal. Note that if the input signal were not sampled and held, it could change in amplitude by an amount sufficient to render the first flash digital amplitude estimate invalid or to drive the first stage amplifier into saturation before the output error signal is even sampled by the second stage. Thus, it is possible to increase the accuracy of a second flash converter in a pipelined stage by preceding it with an amplifier, but this in turn generally necessitates a sample-and-hold circuit.

Pipelined flash converters are capable of high speeds, such as 100 MHZ. Their resolution, however, has typically been limited to around ten bits because of differential linearity errors caused when the first error signal is handed off to the second stage in the pipeline. Another problem has been the lack of high integral linearity in the first stage DAC, which controls the overall linearity of the converter. These converters are therefore usually used in medium-resolution applications, from ten to twelve bits, where the inherent latency of three to five successive conversions does affect the quality of the output data.

In order to overcome the differential linearity limitations in basic and pipelined flash converters, much work in increasing converter resolution has focused on using sample-and-hold circuits and recursive techniques that employ just one feedback DAC with high differential and integral linearity. In these devices, the input is always sampled and held, after which the error signal between the DAC and the input signal is used on multiple cycles to drive the DAC toward the input signal. The final result is the DAC digital input word.

In early recursive converters, a single high-gain comparator processed the error signal. In these devices, the comparator output was then used to perform a binary search for the unknown value of the input signal using a technique widely known as successive approximation. A successive approximation register (SAR) in a feedback path received the comparator output and controlled the feedback DAC to perform a binary search for the held input voltage. Such converters required a relatively long time to convert the unknown input signal to a digital value because several clock cycles were required for each data conversion. With a good feedback DAC, such converters were capable of 16-bit resolution, but at least one clock cycle was required for each bit of resolution. Furthermore, an input sample-and-hold circuit was required to preserve the input amplitude during the time required for the conversion. Additionally, droop in the sample-and-hold over the time required for the conversion led to differential linearity inaccuracies in the converter unless redundant successive approximation steps near the end of the conversion were provided.

A significant improvement in the basic successive approximation converter was made when the single comparator was replaced by a moderate-resolution flash converter and the high-gain amplifier was replaced with a moderate but controlled-gain amplifier. The signal corresponding to the error between the input signal and the feedback DAC could then be converted (after amplification) by the multi-bit flash converter and processed in the feedback path by an adder, whose output was latched and controlled the DAC. The output of the latch also formed the second input of the adder.

Although these improved successive approximation devices could produce more than one bit on each clock cycle, they still required an input sample-and-hold circuit.

Another drawback stemmed from the amplifier: In order to provide high accuracy in these converters, the gain of the amplifier had to be increased on progressive steps. The settling time of the amplifier on high-gain steps was long, however, and significantly slowed the converter.

Further work on multi-bit recursive converters has focused on improving the speed and accuracy of the DAC in the feedback path. The four or five clock cycles required for the analog-to-digital conversion, however, still limits the overall speed of the converter.

When converting analog signals, it is desirable to remove input signal energy, particularly noise, in the frequency range near the sampling frequency of the converter. If the converter sampling frequency can be greatly increased, for example, by quantizing the input every clock cycle, then the order and cost of the anti-aliasing filter required in the input signal amplifier chain can be greatly reduced.

Accordingly, converters known as "sigma-delta" converters later became popular, since they were able to sample the input on each clock cycle and thus greatly ease anti-aliasing. This proved especially beneficial in filter design for audio applications. Early sigma-delta converters used simple, one-bit DACs, which provided inherently high integral linearity without requiring precision in the feedback DAC layout design. In the sigma-delta converter, an error signal produced by the difference between the input voltage and the one-bit DAC is fed to one or more discrete-time switched-capacitor integrating amplifiers before application to the one-bit comparator. The number of integrating amplifiers generally increases with the order of the loop. The one-bit sigma-delta is at present the common choice for audio applications.

One drawback of the sigma-delta converter is that it requires a very high over-sampling ratio (ratio of sampling rate to Nyquist sampling rate) in order to achieve high resolution. Other drawbacks relate to the order of the converter loop. It is well known, for example, that the order of the signal processing feedback loop may be increased to increase the input signal bandwidth for the same converter resolution. The number of integrating amplifiers provided must be increased, however, in proportion to the order of the required loop filter. Other well-known limitations of the sigma-delta converter include spurious tones and an output noise spectral density that increases with frequency at a rate that is proportional to the order of the converter loop.

In addition, the one-bit comparator output in such a converter must be processed over several clock cycles by a digital decimation filter at the output. It is well known that this decimation filter can become quite complex because it must have an order at least one higher than the basic loop in order to remove the large amount of converter quantization noise in the frequency region above the input signal bandwidth. The reason for this increase in quantization noise is the inherent reduction of gain through an integrating amplifier with increasing frequency.

Furthermore, sigma-delta converters sample the input on each clock cycle, and they do not produce a full conversion or quantized output for every sample. Their input generally includes a switched capacitor sampling circuit coupled to a discrete-time integrator—if an input sampling circuit were not used, inaccuracies in the integrator output would arise as a result of any time jitter or glitch energy in the DAC output every time its output changed.

Much early work on sigma-delta converters concentrated on increasing speed beyond the audio signal frequency range by increasing the order of the converter. Because increasing the order of a sigma-delta converter increases the slope of the output noise spectrum, a higher order decimation filter was typically required to recover the output data. Additionally, many techniques were developed to cope with increased stability problems and tones in higher order loops.

Despite increasing the order of the loop, it is still difficult to construct a one-bit sigma-delta converter that can process signal frequencies with bandwidths two orders of magnitude higher than the audio range. Nonetheless, processing such signal frequencies is required to fulfill many of the tasks required for telecommunications data transmission over, for example, copper wire subscriber loops. In an effort to increase the sigma-delta ADC sampling frequency for high-resolution telecommunications applications, designers have replaced the single comparator in the sigma-delta converter with a multi-bit flash converter at the output of the integrating amplifier chain in order to obtain more bits per conversion step. The multi-bit flash output is, in these designs, usually connected to a multi-bit feedback DAC. Such multi-bit flash signal processing reduces the quantization noise of the converter, but it loses the ease of DAC construction offered by the one-bit converter. Additionally, the quantization noise of the converter still increases with frequency in proportion to the order of the converter.

One attempt to ease the difficulty of constructing highly linear DACs in multi-bit sigma-delta converters has concentrated on the implementation of several different multiple-unit capacitive charge redistribution and switching techniques. In these devices, the feedback DAC is usually implemented by switching identical precision capacitors to either a positive or negative reference voltage rather than by switching just one capacitor to a voltage output DAC. Several techniques exist to alternate the precision capacitors in such a way as to reduce detrimental integral linearity effects due to inaccuracies in any one capacitor. In some of these devices, for example, the feedback capacitors are alternated in a pseudo-random fashion to provide acceptable integral linearity.

The multi-bit flash comparator in such a sigma-delta converter has certain speed advantages because the quantization noise form the flash is reduced in proportion to the number of comparators used. The signal bandwidth may be then also be increased considerably over the one-bit case, while still retaining a high signal-to-quantization-noise ratio. Because multiple capacitors are used in these systems, however, large switching current pulses are required in order to fully charge and discharge the input capacitors used for input voltage-to-charge conversion. Furthermore, the multi-bit sigma-delta converter still requires an input sampler and a complex output decimation filter with an order at least one higher than the basic loop.

In many telecommunications applications, such as copper wire-based digital subscriber loops, the noise performance of the ADC is most important at the highest frequencies. In these applications, however, the line attenuates the transmitted signals at high frequencies far greater than at low frequencies. Moreover, the overall resolution of the ADC is not nearly as important as the ADC equivalent resolution or quantization noise spectral density at the highest signal frequencies, which is the very the frequency region where sigma-delta converters have the worst noise performance.

What is needed is therefore a high-resolution ADC system that retains the advantages of the basic flash converter such as sampling the input at clock rates as high as the clock rate itself and completing a conversion on each clock cycle. This is especially true in the area of high-speed data transmission over channels such as twisted pairs of copper wires. At the same time, the system should avoid the conventional need for a sampler or sample-and-hold circuit connected to the input signal, since it would then also be able to avoid the transient currents required in existing devices in order to drive such an input sampling circuit. The ADC should be able to produce a first digital result with a quantizing noise that does not increase significantly with frequency. This in turn would eliminate the requirement for a high-order decimation filter and make possible the use of a second- or third-order lowpass digital filter to produce a second digital result having increased resolution. This invention provides such an ADC system.

SUMMARY OF THE INVENTION

An analog-to-digital converter (ADC) according to the invention includes a fast internal analog to digital converter (ADC) such as a flash converter. The output of a continuous-time amplifier with a and a high-pass transfer characteristic is coupled to the input of the fast internal ADC.

A signal prediction circuit, which predicts a next value of the system input signal, is coupled in a feedback path. Its input is the output of the fast ADC, preferably scaled down in a scaling circuit by a factor equal to the closed-loop forward gain A of the amplifier. The prediction circuit preferably has a low-pass characteristic. The output of the prediction circuit, which is preferably latched, is then applied as the input to a feedback digital-to-analog converter (DAC). An input differencing circuit then outputs an analog error signal that is the difference between the system input signal and the output from the DAC. The analog system input signal does not have to be sampled and held before being differenced with the feedback signal from the DAC. The digital system output signal is formed as the sum of the predicted next input signal value and the scaled output of the fast ADC. This summed signal is preferably low-pass filtered.

DETAILED DESCRIPTION

Figure 1:
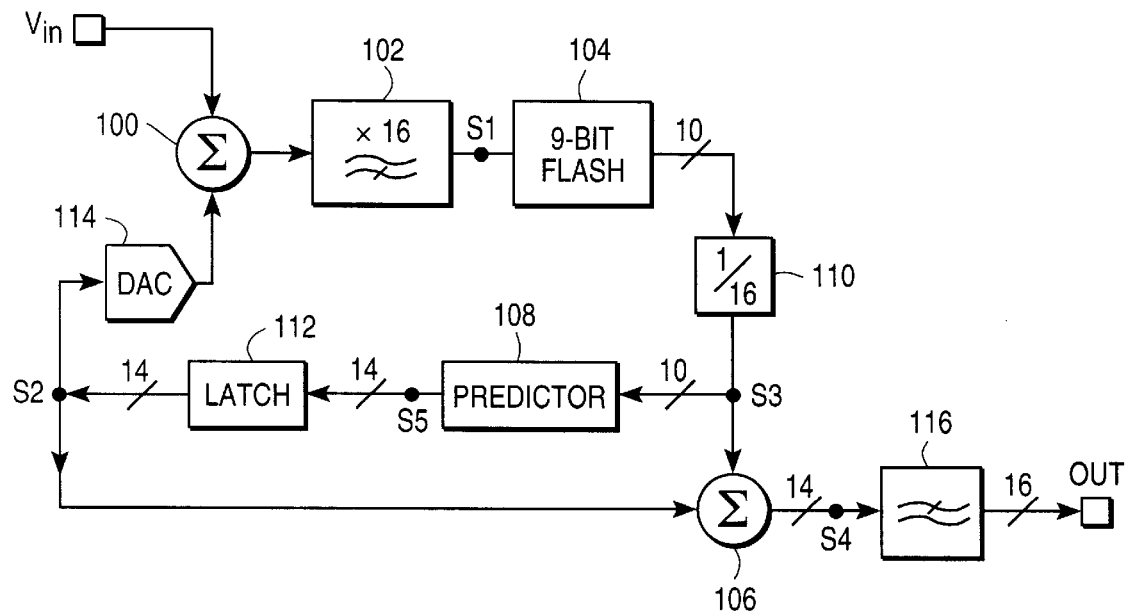
FIG. 1 is a simplified block diagram of the flash analog-to-digital converter (ADC) according to the invention.

FIG. 1 is a simplified block diagram of the analog-to-digital converter (ADC) according to the invention. As the figure shows, the analog input signal Vin, that is, the analog signal one wishes to convert into a digital approximation, forms one input to an analog input differencing circuit (subtractor or "differencer") 100, the output of which forms an input signal to an amplifier 102. Note that no sampler, or sample-and-hold circuit, is connected to the input signal Vin.

Various other components may be needed to operate the ADC according to the invention. For example, a master clock must be provided to generate the clock pulses that synchronize several of the invention's components. In the illustrated example of the invention, the master clock rate is assumed to be 35 MHZ and the input signal bandwidth is assumed to be approximately 1 MHz. As another example, voltage supplies are needed to provide not only reference voltages (described below), but also bias current and voltage for certain elements such as an operational amplifier. Because components and circuits such as these are so well understood, they are neither specifically discussed nor illustrated.

The amplifier 102, for reasons given below, preferably has a moderate closed-loop forward gain A of, for example, 16, as well as a high-pass characteristic. The amplifier's output, which is labeled as the analog signal S1, is connected to the input of a conventional nine-bit flash converter 104. The converter 104 thus constitutes an internal ADC, within the ADC formed by the entire invention. Using a flash converter as a reduced-bit-length "core" converter provides speed without requiring the unacceptably large number of comparators one would need for, for example, a full 16-bit flash converter. The output of the flash converter 104 is shown as being ten-bit resolution. As is well understood in the art of ADC design, the "extra" bit is used for more accurately representing signals that fall between the comparator channel boundaries. In the preferred embodiment of the invention, the flash ADC 104 should be chosen so that its digital signal output resolves following the negative-going edge of the master clock (in this example, 35 MHZ).

In the following description of the invention, various gains, clock rates and resolutions (in number of bits or specified by a number of components) are given. Unless stated otherwise, however, these numbers are only examples. They have been chosen in part because they are the values used in a successful simulation of the invention, and in part because they provide both speed and stability within the physical limitations of existing amplifiers. Certain alternative choices are explained below. Others will be obvious to those skilled in the art of analog-to-digital converters.

The ten-bit output of the nine-bit flash converter 104 is digitally scaled down by a factor equal to the binary value of the closed-loop forward gain of the amplifier 102 before being applied as input signals to both a digital summer 106 and a digital signal prediction circuit 108. The added tenth bit or LSB of the flash output is always a binary "1." This technique is well known to produce a digital output value from the flash converter that is half-way between the digital representation of each comparator level. In the case where the closed-loop forward gain of the amplifier 102 is a power n of two, that is, $2^{**}n$, then the scaling down of the output signal of the flash converter 104 can be carried out quickly and easily using an n-bit digital shift 110 (which, as is commonly done, can be implemented simply by appropriate wiring), as is well known in the field of digital design. In FIG. 1, the output of the divider/shifter 110 is labeled S3. If the closed-loop forward gain of the amplifier 102 is chosen to be something other than a power of 2, then a suitable conventional digital dividing circuit will need to be used in place of the shifter 110.

The 14-bit output (labeled S5) of the digital signal prediction circuit 108 is first latched by a conventional latching circuit 112, whose latched output value forms not only the input signal to a feedback digital-to-analog converter (DAC) 114 but also the second input signal to the digital summer 106. As the figure shows, the input signal to the filter/predictor 108 has ten bits, whereas its output has 14 bits. The additional four bits are generated by the scaling inherent in the filter, whose output signal should range over the same full scale digital range as the system input signal. The prediction circuit 108 will produce an output with significance increased by four bits. The output of the latch 112 is preferably updated on the positive-going edge of the ADC master clock so that, on every positive clock edge, the DAC 114 input is updated and held. The analog output of the DAC 114 forms the second input to the input differencing circuit 100.

Finally, the 14-bit output (labeled S4) of the summer 106 is preferably passed through a digital low-pass filter 116, whose 16-bit output is also the final, digital converted output signal OUT of the entire ADC according to the invention. The lowpass filter 116 is preferably included in order to restrict the bandwidth of the output signal to be approximately the same as the bandwidth of the system input signal Vin. This, in turn, reduces the quantization noise in the frequency region above the passband of the input signal. It is well known that, at increased sampling frequencies, and with band limiting, one can achieve more bits of resolution by the use of a lowpass filter. An increase from 14 to 16 bits is merely one example of the results of a filter choice that proved effective in simulations of the invention. Any conventional design techniques may be used to select a proper digital lowpass filter 116.

In other words, the output of the flash converter 104, after scaling to compensate for the closed-loop forward gain of the preceding amplifier 102, is fed back to the amplifier 102 input along a negative path that also includes a circuit that predicts the next value of the input signal. Also, although the structure and function of the prediction circuit 108 is described in greater detail below, one can observe already at this point that if the latched value of the prediction circuit's output is sufficiently close to the digital equivalent of the analog input signal Vin, then the output of the flash converter 104 will be less than full scale. Then the accurate digital representation of the input signal will be just the sum of the prediction circuit's latched output and the scaled value of the flash output.

Figure 2:
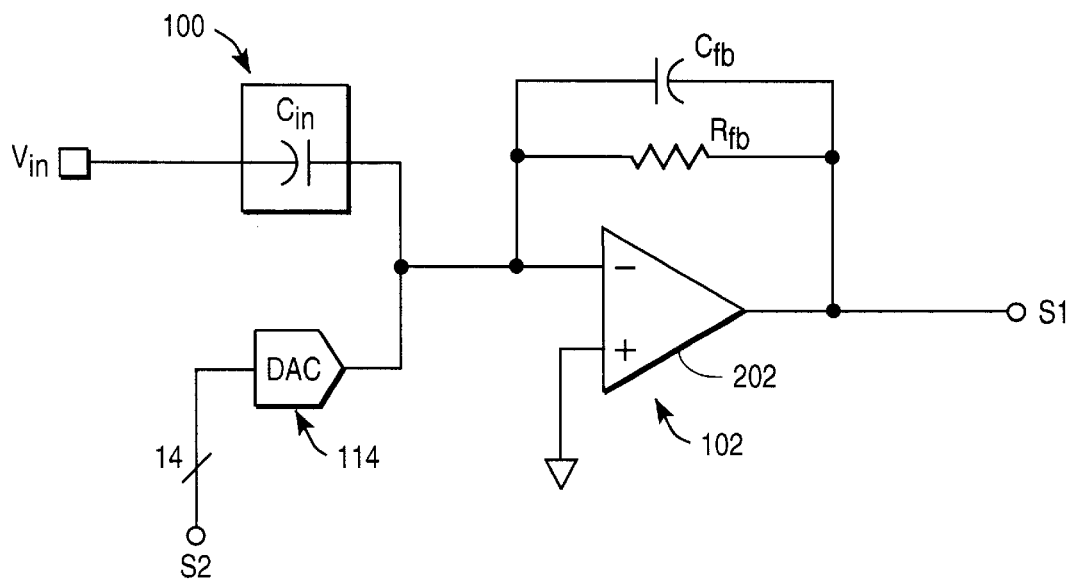
FIG. 2 illustrates a preferred differencing and error amplification portion of the circuitry of the ADC according to the invention.
Figure 3:
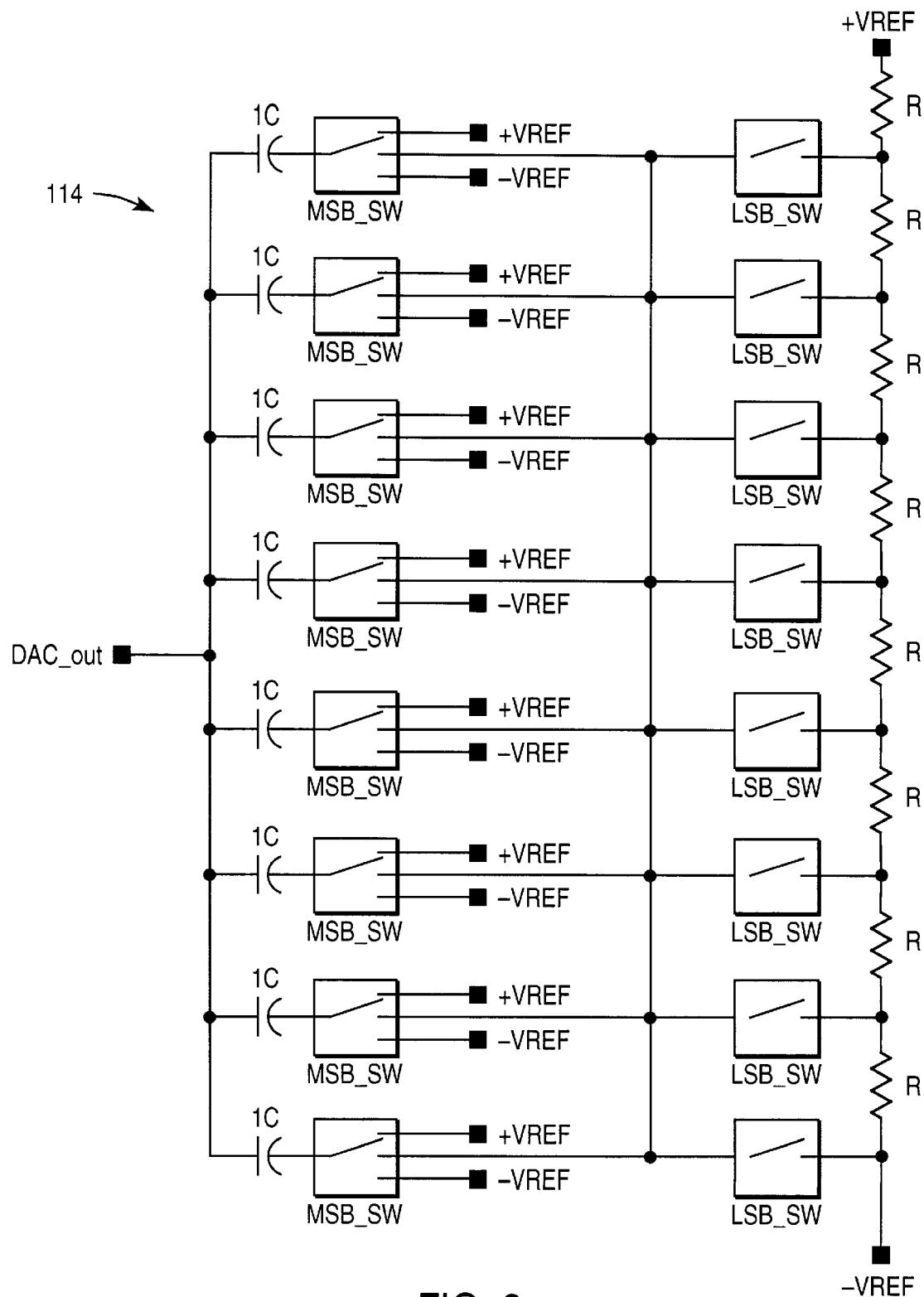
FIG. 3 illustrates the general structure of a simplified feedback digital-to-analog converter (DAC) used in the invention, which utilizes capacitive charge redistribution techniques.

FIG. 2 shows in greater detail the preferred embodiment of the input portion of the invention, which includes the differencing circuit 100, the amplifier 102, and the DAC 114. FIG. 2 also illustrates the preferred method by which the input voltage summation is carried out using capacitive charge redistribution techniques, assuming that DAC 114 is configured to produce a charge output, as shown in FIG. 3. Note that the input circuit ADC does not require the input signal (voltage) to be switched, or sampled and held.

As FIG. 2 shows, the input voltage signal Vin is applied to a capacitive bank Cin, which is constructed in a known manner using, for example, 64 unit capacitors. The unit of capacitance may be chosen in any conventional manner; one suitable value would be in the range of 0.1 pF. The input is thus operatively coupled in a continuous-time manner to the virtual ground of an operational amplifier 202. In FIG. 1, the differencing circuit 100 is shown as being connected directly to the voltage signal Vin and thus appears to be summing voltages. In FIG. 2, however, it is the output charges of DAC 114 and the capacitor bank 100 that are summed at the input to the amplifier 102. These are equivalent operations. The representation in FIG. 1 has been chosen because it more clearly shows the function of the components, whereas FIG. 2 more clearly shows the structure of the preferred embodiment.

The operational amplifier 202 forms the primary gain component of the amplifier 102, and has a feedback capacitor Cfb and a feedback resistor Rfb coupled in parallel in its feedback path. The capacitance of the feedback capacitor Cfb is preferably equal to that of four unit capacitors. In this example, the operational amplifier closed-loop forward gain A is therefore equal to Cin/Cfb=16.

The DAC 114 is preferably a capacitor charge redistribution DAC, whose output is coupled to the same virtual ground or negative input of the operational amplifier 202 as the output of the capacitor bank Cin and the amplifier's feedback path. The operational amplifier 202 thus has the preferred voltage closed-loop forward gain of 16 with respect to the input voltage Vin since the ratio of Cfb to Cin is 64/4=16. The operational amplifier's 200 output is the signal S1.

The DAC 114 operates to produce an output charge with full amplitude equal to a positive reference voltage Vref times the capacitance, which is equal to the 64 unit capacitors of the capacitor bank 100 (FIG. 2). This charge, as well as the charge resulting from the input voltage being applied to the 64 unit input capacitors, are summed at the summing junction or virtual ground of the operational amplifier and converted to an output voltage with an effective closed-loop forward gain of 16 by the feedback capacitor Cfb. Signal polarities are chosen around the ADC control loop as shown so that, for positive input voltages and input charge, the DAC will tend to produce an offsetting or canceling negative input charge. When the DAC code closely represents the ADC input voltage Vin, then the charge difference between the input and DAC charge is small and the output voltage from the operational amplifier remains small and thus well below its saturation voltage.

In FIG. 2, the amplifier feedback resistor Rfb is implemented with a highly resistive path such as may be provided by the feedback capacitor Cfb self-leakage or insulator leakage between output and input. Very high values of feedback resistance are acceptable because there are no semiconductor switches required at the amplifier input. The absence of switches also directly results in the absence of parasitic junction leakage at the input. The unit capacitance may be, for example, 0.1 pF and the feedback resistor Rfb must then be chosen, using normal design methods, to provide a long RC time constant with respect to the period of the input signal's low-frequency components.

FIG. 3 illustrates in simplified form the general structure of the preferred configuration of the capacitor charge redistribution DAC 114 used in the invention. This configuration is preferred because it is fast. Any other conventional DAC may be used instead, however, as long as its output charge is proportional to its digital input signal and it is fast enough to provide a full-charge output signal in less than one-half of a clock cycle.

Assume now for the sake of simplicity that the digital input to the DAC 114 has a resolution of only six bits. In the example, of FIG. 3, the least significant three bits (LSB) of the input signal DAC_in are decoded to drive a series of $2^3=8$ functionally single-pole, single throw solid-state switches LSB_SW, each of which is connected to a corresponding branch of a resistive ladder (the series of resistors labeled R) that linearly divides a voltage range from +Vref to −Vref. The three most significant bits (MSB) of DAC_in are decoded to drive a series of $2^3=8$ functionally single-pole, triple-throw solid-state switches MSB_SW, which couple each of the eight corresponding unit capacitors 1C to either +Vref, or to −Vref, or to the LSB voltage output of the one closed LSB switch. The combined charges from the capacitors 1C form the DAC's 114 output signal DAC_out, which is coupled to the operational amplifier 102 (FIG. 2).

The switches MSB_SW and LSB_SW are preferably operated progressively using well-known conventional decoding techniques. These techniques, as well as the construction and operation of switches such as MSB_SW and LSB_SW, are well known in the art of analog and digital conversion, they are not described further here.

In the embodiment of the invention illustrated in FIG. 1, the input to DAC 114 has 14 bits. In the preferred embodiment of the invention, these are partitioned into 6 MSBs and 8 LSBs. There will therefore be $2^6=64$ unit capacitors (and corresponding MSB_SW switches) and a ladder of $2^8=256$ resistors R (and corresponding LSB_SW switches). Conventional decoding is then used to control the switches in the well-understood manner. FIG. 3 thus illustrates the simplified 3:3 MSB:LSB case merely to reduce the complexity of the figure while clarifying the structure.

Figure 4:
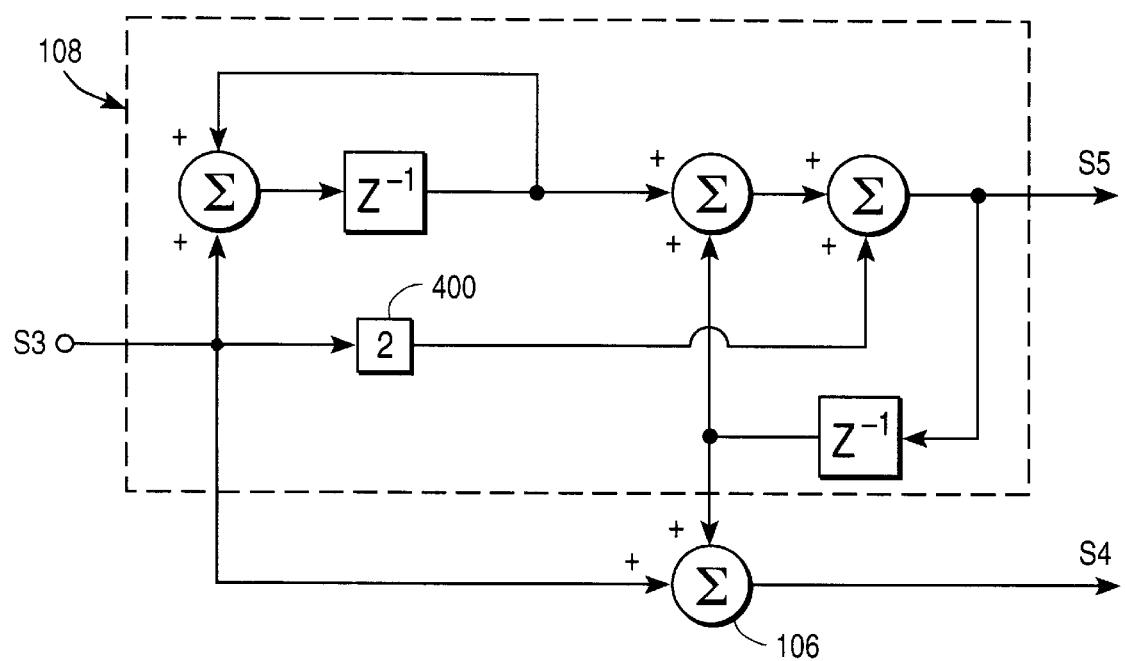
FIG. 4 is a block diagram that shows the structure of a prediction circuit used in the invention.

FIG. 4 illustrates one embodiment of the digital signal prediction circuit 108 that was tested successfully in a simulation of the invention. In this figure, standard symbols Σ and $z^{-1}$ are used to designate, respectively, summers and first-order backward shift operators. Thus, $z^{-1} S_5(t)=S_5(t-1)$. In other words, each $z^{-1}$ block latches and outputs the value of its input from one time unit (in this case, clock cycle) earlier. Both the function and construction of summers and $z^{-1}$ blocks are well understood in the art of digital design and are therefore not described further.

The block labeled 400 functions as an operator to increase by one bit the significance of its input signal. This can be done simply by proper routing of the wiring for the input bits, or by a single left-shift operation, which has the effect of multiplying the input value by two. Using conventional techniques, the circuit shown in FIG. 4 can be shown to produce the following results:

$$S4=S3/(1-z^{-1})^2$$

$$S5=S3 \cdot [(2-z^{-1})/(1-z^{-1})^2]$$

In other words, the prediction circuit is a second-order digital lowpass filter. It is well known that the error at the output of the summing junction of a closed-loop linear system is reduced by a factor equal to the inverse of the effective loop gain for any given frequency. Furthermore, in order to prevent saturation of the gain element, its input must be bounded to fall within a fraction of the output full-scale voltage that is no more than the inverse of its closed-loop gain. It can be shown through conventional calculations using linear filters, as well as simulations, that the filter illustrated in FIG. 4 meets these requirements for the chosen amplifier closed-loop forward gain of 16. As such, the output of the filter will fall within 1/16 of the full-scale value of the input signal for any frequencies in the chosen bandwidth. Consequently, the filter 108 acts to "predict" the next value of the input signal in the sense that the output of the filter will fall within the allowable 1/16 range to prevent amplifier saturation. Known design methods may be used, however, to replace the illustrated filter 108 with any other that meets the same requirements.

The lowpass characteristic of the prediction circuit also ensures ADC control loop stability without requiring a lowpass function in the gain amplifier 102 that drives the flash converter 104. The output of the prediction circuit block is held in a transparent latch 112 on the negative half-cycle of the master clock and passed through to the output on the positive half-cycle because data patterns change in the digital signal prediction block during the negative half-cycle of the master clock.

The flash converter 104 and the digital signal prediction block 108 operate at a higher frequency than that of the input signal Vin in order to avoid the introduction of any unwanted lags, and to provide adequate settling time for the various components. In a system involving conversion of signals for transmission over a twisted pair of copper conductors, for example, the bandwidth of the input signal was approximately 1 MHZ, whereas the clock rate of the flash converter and the prediction circuit were chosen to be 35 MHZ.

Both the prediction circuit 108 and the filter 116 have low-pass characteristics. The result of the flash converter 104 is produced prior to the lowpass characteristic in the loop. The quantization noise spectral density produced by the flash converter, however, is relatively constant with frequency. The first digital result does not therefore have a quantization noise spectral density proportional in frequency to the order of the digital filter in the digital signal prediction circuitry.

As is mentioned above, one use of the invention that has proven particularly advantageous is for conversion of signals for transmission over long (2–3 km) twisted-pair conductors. At present, the bandwidth of such a transmission channel is roughly 1 MHZ. For such an input signal bandwidth, and a sampling rate of approximately 35 MHZ, calculations and simulations have shown that the closed-loop forward gain of the amplifier 102 (FIG. 1) should preferably be less than 25 in order to stay well within the prediction range of the circuit. A closed-loop forward gain of 16 was chosen because 16 is the largest power of two less than this maximum advisable gain. Having a power of two as the closed-loop forward gain not only simplifies other circuitry, such as the shifter/divider 110, but it is also hardware efficient, since multiplication and division by n-bit binary words that are powers of two correspond to simple n-bit left and right shifts of digital words. Note that such shifts can be implemented using wire connections rather than active components.

One other advantage of a closed-loop forward gain of 16 is that it has proven efficient even from the standpoint of working within the physical limits of the components used to implement the amplifier. Nonetheless, the moderate closed-loop forward gain of 16 is only one possible choice. For use in systems with greater or less input signal bandwidth, conventional experiments, calculations and test results may be used to select a different closed-loop forward gain. Necessary corresponding changes to other components of the system will then also be obvious.

Certain differences and advantages of the invention as compared with the prior art should now be clear. Because the next value of the input signal is predicted with an accuracy higher than, for example, 1/16 of full scale, the amplifier 102 will not saturate at the time of the next predicted input signal value, even with no sample-and-hold circuit at the input of the converter. In addition, the output of the amplifier 102 with a closed-loop forward gain of 16 is not saturated at the time of the next predicted sample. As a result, the ADC according to the invention is able to produce a full conversion on each clock cycle.

Furthermore, unlike the prior art converters described above, the DAC 114 is not connected directly, or through any simple adder or SAR, to the flash comparator output. Instead, the DAC is driven by the highly accuracy digital signal processing circuit 108, which provides an estimate of the next, not the previous, value of the input signal.

Providing to the DAC a highly accuracy estimate of the next value of the input signal allows the use of a moderate closed-loop forward gain (for example, the illustrated closed-loop forward gain of 16), amplifier to be used after the input differencing circuit 100. Such a closed-loop forward gain of 16 increases the effective resolution of the flash converter by 4 bits from 9 to 13 bits ($16=2^4$).

If the ADC is clocked at a frequency that is 32 times the signal bandwidth, or 16 times the normal Nyquist sampling frequency, then another 2-bit increase in resolution results, provided that the bandwidth of the converter's output low-pass filter is set equal to the input signal bandwidth. The converter is then capable of achieving quantizing noise levels equivalent to approximately 15 bits of resolution while still maintaining sample clock rates as high as, for example, 30 MHZ or higher.

If the converter output is obtained from the sum of the digital code driving the DAC and the next flash converter digital output (down-shifted by 4 bits, for example in circuit 110), then a complete data conversion is produced for each clock cycle. Because the use of integrating amplifiers is avoided, the output digital filter required to provide the 2-bit increase in resolution obtained by oversampling may be of low order and minimum complexity. The use of integrating amplifiers is avoided by guaranteeing system stability with a lowpass digital filter characteristic in the digital prediction circuit 108.

One other advantageous feature of the invention is its use of unswitched, continuous-time input elements such as the precision capacitors in the bank 100 (FIG. 2), which are approximately equal in capacitance to those coupled to the DAC 114. (There are preferably 64 unit capacitors in each.) The error amplifier 102 may also be made entirely of continuous-time components with a high-pass characteristic beyond, for example, approximately 10 Hz.

I claim:

1. An analog to digital converter comprising:
   a fast internal analog to digital converter (ADC);
   an amplifier with a closed-loop forward gain A;
   a digital signal prediction circuit coupled in a negative feedback path and having, as its input signal, a digitized error signal;
   a digital to analog converter (DAC) included in the feedback path;
   an input differencer;
   in which:
      an output of the DAC and the analog system input signal are connected as inputs to the differencer;
      an output of the differencer is an analog error signal that is connected as an input to the amplifier;
      an output of the amplifier is as an input to the fast internal ADC;
      a scaled output of the fast ADC is the digitized error signal, which is connected directly as the input signal of the digital signal prediction circuit;
      an output of the digital signal prediction circuit is operatively coupled as an input of the DAC.

2. An analog to digital converter as in claim 1, in which a digital system output signal is formed from the output of the digital signal prediction circuit and a scaled output of the fast ADC.

3. An analog to digital converter as in claim 2, further including a digital low-pass filter having as its input the sum of the output of the digital signal prediction circuit and a scaled output of the fast ADC and having as its output the digital system output signal, the digital lowpass filter comprising filter means for bandlimiting the quantization noise of the digital system output signal.

4. An analog to digital converter as in claim 1, further comprising a scaling circuit reducing the output of the fast ADC by a factor of the amplifier closed-loop forward gain A and connected immediately after the ADC.

5. An analog to digital converter as in claim 1, in which the amplifier is a continuous-time analog amplifier.

6. An analog to digital converter as in claim 1, in which the amplifier has a high-pass transfer characteristic.

7. An analog to digital converter as in claim 1, in which the digital signal prediction circuit has a low-pass transfer characteristic.

8. An analog to digital converter as in claim 1, in which the analog system input signal is connected to the differencer as an unsampled and unheld input signal.

9. An analog to digital converter as in claim 1, in which the output of the differencer is connected directly to the amplifier.

10. An analog to digital converter for converting an analog system input signal to a digital system output signal, comprising:
    a fast internal analog to digital converter (ADC);
    a continuous-time amplifier with a closed-loop forward gain and a high-pass transfer characteristic;
    a scaling circuit reducing the output of the fast ADC by a factor equal to the amplifier closed-loop forward gain and connected immediately after the ADC;
    a digital signal prediction circuit coupled in a negative feedback path and having, as its input signal, a digitized error signal;
    a digital to analog converter (DAC) included in the feedback path;
    a digital latch circuit connected in the feedback path between the digital signal prediction circuit and the DAC;
    an input differencer;
    a digital low-pass filter having as its input the sum of the output of the digital signal prediction circuit and a scaled output of the fast ADC and having as its output the digital system output signal;
    in which:
       an output of the DAC and the analog system input signal are connected as inputs to the differencer, the analog system input signal being connected to the differencer as an unheld input signal;
       an output of the differencer is an analog error signal that is the difference between a system input signal and the output from the DAC and is connected as an input to the amplifier;
       an output of the amplifier is connected as an input to the fast ADC;
       a scaled output of the fast ADC is the digitized error signal, which is connected directly as the input signal of the digital signal prediction circuit;
       an output of the digital signal prediction circuit is operatively connected as an input of the DAC via the digital latch circuit;
       the digital system output signal is formed as a filtered sum of the output of the digital signal prediction circuit and a scaled output of the fast ADC; and
       the digital signal prediction circuit has a low-pass transfer characteristic.

11. A method for analog-to-digital conversion of an analog system input signal to a digital system output signal comprising the following steps:
    forming an error signal by differencing the analog system input signal and an output of a feedback signal;
    amplifying the error signal by a factor A;
    converting the amplified error signal to digital form, thereby forming a digitized error signal, in a fast analog-to-digital converter ADC; and
    predicting, in a negative signal path a next input signal value as a predetermined function of the amplified and converted error signal, the predicted next input signal value also forming the feedback signal;
    forming the digital system output signal as a sum of the feedback signal and the digitized error signal scaled-down by the factor A.

12. A method as in claim 11, in which the step of amplifying the error signal comprises amplifying the error signal in a continuous-time manner.

13. A method as in claim 11, in which the step of amplifying the error signal also comprises amplifying the error signal with a high-pass characteristic.

14. A method as in claim 11, in which the step of predicting the next input signal value also comprises simultaneously low-pass filtering the amplified and converted error signal.

15. A method as in claim 11, in which the step of forming an error signal further comprises differencing the analog system input signal in an unsampled and unheld form.

* * * * *